(12) United States Patent
Nakahara et al.

(10) Patent No.: US 6,661,260 B2
(45) Date of Patent: Dec. 9, 2003

(54) OUTPUT CIRCUIT OF SEMICONDUCTOR CIRCUIT WITH POWER CONSUMPTION REDUCED

(75) Inventors: Akihiro Nakahara, Tokyo (JP); Akio Tamagawa, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/105,375

(22) Filed: Mar. 26, 2002

(65) Prior Publication Data

US 2002/0140466 A1 Oct. 3, 2002

(30) Foreign Application Priority Data

Mar. 27, 2001 (JP) .......................................... 2001-091196

(51) Int. Cl.[7] .................................................. H03K 3/00
(52) U.S. Cl. ........................ 327/109; 327/112; 327/427
(58) Field of Search ................................ 327/112, 108, 327/109, 111, 427, 434, 545, 546; 326/82, 83, 87, 86

(56) References Cited

U.S. PATENT DOCUMENTS 4,386,286 A * 5/1983 Kuo .............................. 326/83
5,013,940 A * 5/1991 Ansel ........................... 326/83
6,337,587 B2 * 1/2002 Kruecke ...................... 327/112

FOREIGN PATENT DOCUMENTS

| JP | 6-81025 | 10/1994 |
| JP | 2646786 | 5/1997 |
| JP | 2000-58671 | 2/2000 |

* cited by examiner

Primary Examiner—Toan Tran
(74) Attorney, Agent, or Firm—Young & Thompson

(57) ABSTRACT

An output circuit of a semiconductor circuit includes a higher potential side power supply line, a output signal line on which an output signal is outputted, a control signal line on which a control signal is transferred, a gate signal line on which a gate signal is transferred, an output transistor, a first switch and a gate driving circuit. The output transistor is connected between the higher potential side power supply line and the output signal line to operate in response to the gate signal on the gate signal line. The first switch is connected to the higher potential side power supply line to turn off in response to the control signal of a first state and turn on in response to the control signal of a second state. The gate driving circuit is connected between the first switch and the control signal line to generate the gate signal onto the gate signal line based on a gate control signal when the first switch is turned on.

16 Claims, 8 Drawing Sheets

US 6,661,260 B2

OUTPUT CIRCUIT OF SEMICONDUCTOR CIRCUIT WITH POWER CONSUMPTION REDUCED

BACKGROUND OF THE INVENTION

1. Field of the Invention

The present invention relates to a semiconductor circuit, and more particularly to an output circuit of a semiconductor circuit.

2. Description of the Related Art

An output circuit of a semiconductor circuit in which a plurality of semiconductor devices are arranged, is known in Japanese Patent No. 2,646,786 as shown in FIG. 1. In the output circuit, an N-channel MOS transistor is generally used as an output transistor. The on and off states of the output transistor is controlled by a gate driving circuit. A conventional example of the circuit structure of the gate driving circuit is shown in FIG. 2.

A conventional semiconductor output circuit shown in FIG. 1 is comprised of an output transistor 101, a gate driving circuit 102 which supplies a gate signal to the gate of the output transistor 101, a control circuit 103, and a switch 104 connected the source and gate of the output transistor 101. The control circuit 103 has a protection circuit such as an over-current detecting circuit and an over-temperature detecting circuit and transfers a control signal to the gate driving circuit 102.

Referring to FIG. 2, the gate driving circuit 102 is comprised of first and second inverter circuits and a boosting circuit. The first inverter circuit is comprised of a P-channel transistor 122 and an N-channel transistor 123 connected in series. The second inverter circuit is comprised of a P-channel transistor 105, an N-channel transistor 121 of a diode connection, and an N-channel transistor 106. The boosting circuit is comprised of an N-channel transistor 113, a capacitor C and an N-channel transistor 114.

The switch 104 is shown in FIG. 3, and is comprised of an N-channel transistor 131, a resistance R101 and an N-channel transistor 132.

FIG. 4 shows a modification of the semiconductor output circuit in which the gate driving circuit 102 shown in FIG. 2 and the switch 104 shown in FIG. 3 are applied to the circuit shown in FIG. 1. Referring to FIG. 4, in the above conventional semiconductor output circuit, when an output transistor on control signal 108 to turn on the output transistor 101 is supplied to the control circuit 103, a low level is given to the input of the CMOS inverter of the transistors 105 and 106. In the CMOS inverter, the transistor 105 can be turned on quickly. Through the turning on operation of the CMOS inverter, the output transistor 101 is set to the on state. When the gate driving circuit 102 increases the gate voltage of the output transistor 101 higher than the power supply voltage, the transistor 121 with a diode connection is inversely biased to prevent that the charge flows through the P-channel transistor 105. Such prevention enables the gate potential of the output transistor 101 to be kept sufficiently high.

When an output transistor off control signal 109 to turn off the output transistor 101 is supplied to the gate driving circuit 102, the gate voltage of the output transistor 101 becomes the ground potential (0V), and the output transistor 101 is set to the off state. At this time, the N-channel transistor 132 is turned on in response to the output transistor off control signal 109. As a result, the gate and source of the output transistor 101 are connected to form a short circuit, and it is prevented that the output transistor 101 is turned on when the source potential becomes negative.

In such a conventional semiconductor output circuit, the circuit current flows through the gate driving circuit 102 and the control circuit 103, even when the output transistor 101 is in the off state. Thus, dark current at the off time becomes large and the power is wastefully consumed. Moreover, as shown in FIG. 4, when the output transistor 101 is in the off state and when a negative voltage is applied to an output signal line 110, there are parasitic current flow routes. One parasitic current flow route is of the power supply line 111→the transistor 106→the N-channel transistor 132→the output signal line 110, and another parasitic current flow route is of the power supply line 112→the transistor 113→transistor 114→the N-channel transistor 107→the output signal line 110. Therefore, the parasitic current in the switching operation of the switch 104 flows wastefully.

It is demanded to prevent the wasteful consumption current which flows through a control circuit and a switching circuit in the off state of the output transistor and the switching operation.

In conjunction with the above description, a gate driving circuit is disclosed in Japanese Examined Patent Application (JP-B-Heisei 6-81025). In the gate driving circuit, the gate of an output transistor of an N-channel MOS transistor is driven which is used as a source output. A voltage boosting circuit carries out a boosting operating of a voltage according to a trigger inputted and gives a boosted voltage to the gate of the output transistor. A first CMOS inverter circuit inputs a low level signal at the same timing as the trigger inputting and an output point is connected with the gate of the said the output transistor. An N-channel MOS transistor for countercurrent prevention is connected to a point between a P-channel MOS transistor of the first CMOS inverter circuit and the output point of the first CMOS inverter circuit, and the gate and drain thereof are connected to those of the P-channel MOS transistor. A second CMOS inverter circuit is provided in parallel to the first CMOS inverter circuit, and an input point is same as that of the first CMOS inverter circuit, and an output point is connected with a background gate of the N-channel MOS transistor for the countercurrent prevention.

Also, a semiconductor integrated circuit is disclosed in Japanese Laid Open Patent application (JP-P2000-58671A). In this reference, a level shift circuit is composed of an N-channel MOSFETs and a P-channel MOSFETs. The N-channel MOSFETs are used for the high side and low side of an output stage circuit. A resistance and a diode are provided in parallel to the N-channel MOSFET on the said high side between the gate and source. The cathode of the diode is connected with the gate and the anode of the diode is connected with the source.

SUMMARY OF THE INVENTION

Therefore, an object of the present invention is to provide an output circuit of a semiconductor circuit, in which it is possible to prevent wasteful consumption current.

Another object of the present invention is to provide an output circuit of a semiconductor circuit, in which it is possible not to flow a parasitic current when a negative voltage is applied to the source of an output transistor.

In an aspect of the present invention, an output circuit of a semiconductor circuit includes a higher potential side power supply line, a output line on which an output signal is outputted, a control signal line on which a control signal is transferred, a gate signal line on which a gate signal is transferred, an output transistor, a first switch and a gate driving circuit. The output transistor is connected between the higher potential side power supply line and the output signal line to operate in response to the gate signal on the gate signal line. The first switch is connected to the higher potential side power supply line to turn off in response to the control signal of a first state and turn on in response to the control signal of a second state. The gate driving circuit is connected between the first switch and the control signal line to generate the gate signal onto the gate signal line based on a gate control signal when the first switch is turned on.

Here, the output transistor may be a first N-channel transistor. The output circuit may further include a second switch connected between the gate signal line and the output signal line to turn on in response to the control signal of the first state and to turn off in response to the control signal of the second state. In this case, the output circuit may further include a first resistance connected between the gate signal line and the output signal line.

The first switch may include a first P-channel transistor. The control signal is supplied directly to a gate of the first P-channel transistor.

Also, the output circuit may further include second and third resistances connected between the higher potential side power supply line and the control signal line in series. The first switch may include a first P-channel transistor, and the control signal is supplied to a gate of the first P-channel transistor via the third resistance.

Also, the output circuit may further include a protection circuit connected between the higher potential side power supply line and the control signal line to generate the gate control signal from the control signal. The output circuit may further include a lower potential side power supply line, and a protection circuit connected between said higher potential side power supply line and said lower potential side power supply line to generate said gate control signal from said output signal in addition to said control signal. The protection circuit may include at least one of an over-current detecting circuit or an over-temperature detecting circuit, and generates the gate control signal from an output of the at least one of an over-current detecting circuit or an over-heating detecting circuit, in addition to at lease one of the control signal and the output signal.

Also, the output circuit may further include a lower potential side power supply line, and a third switch connected between the higher potential side power supply line and the lower potential side power supply line to generate the control signal of the first state based on a supplied control signal of the second state and to generate the control signal of the second state based on the supplied control signal of the first state and outputs the control signal onto the control signal line. The third switch may connect the control signal line to the lower potential side power supply line in response to the supplied control signal of the first state. In this case, the output circuit may further include a fourth switch and a fifth switch. The fourth switch is connected between the gate signal line and the lower potential side power supply line to generate a switching control signal of the first state in response to the supplied control signal of the second state and to generate the switching control signal of the second state in response to the supplied control signal of the first state. The fifth switch is connected between the gate signal line and the output signal line to turn on in response to the switching control signal of the first state and to turn off in response to the switching control signal of the second state.

Also, the fourth switch may include a fourth resistance connected with the gate signal line, and a second N-channel transistor. The second N-channel transistor is connected between the fourth resistance and the lower potential side power supply line to turn off in response to the supplied control signal of the second state and to turn on in response to the supplied control signal of the first state. In this case, it is desirable that the fourth resistance has a resistance value for suppressing parasitic current.

The third switch may include a fifth resistance connected with the higher potential side power supply line, and a third N-channel transistor connected between the fifth resistance and the lower potential side power supply line to receive the supplied control signal at a gate of the N-channel transistor. The control signal line is connected to a node between the fifth resistance and the third n-channel transistor.

Also, the third switch may include a fifth resistance connected with the higher potential side power supply line, sixth and seventh resistances connected with the lower potential side power supply line in series, and a third N-channel transistor connected between the fifth resistance and the lower potential side power supply line to receive the supplied control signal at a gate of the third N-channel transistor via the sixth resistance. The control signal line is connected to a node between the fifth resistance and the third n-channel transistor.

Also, the third switch may include a second P-channel transistor connected with the higher potential side power supply line, and a fourth N-channel transistor connected between the second p-channel transistor and the lower potential side power supply line. The supplied control signal is supplied to a gate of each of the fourth N-channel transistor and the second P-channel transistor, and the control signal line is connected to a node between the fourth N-channel transistor and the second P-channel transistor.

DESCRIPTION OF THE PREFERRED EMBODIMENTS

Hereinafter, an output circuit of a semiconductor circuit of the present invention will be described below with reference to the attached drawings.

Figure 1:
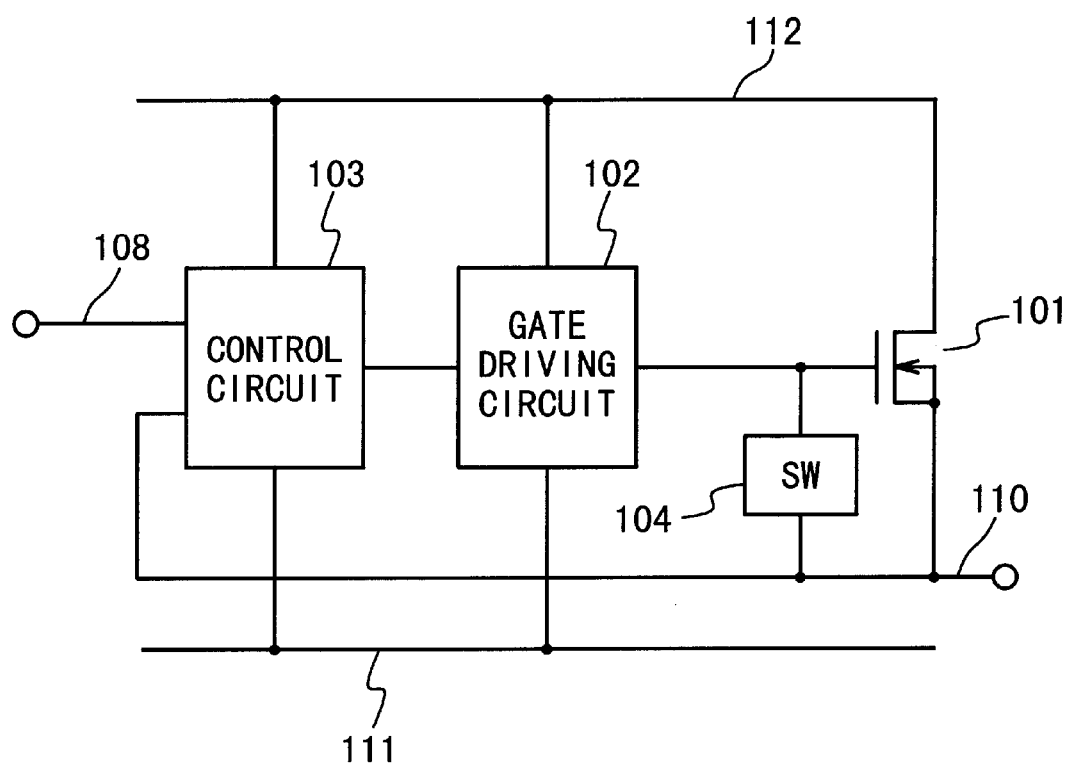
FIG. 1 is a circuit diagram showing a conventional output circuit of a semiconductor output circuit.
Figure 2:
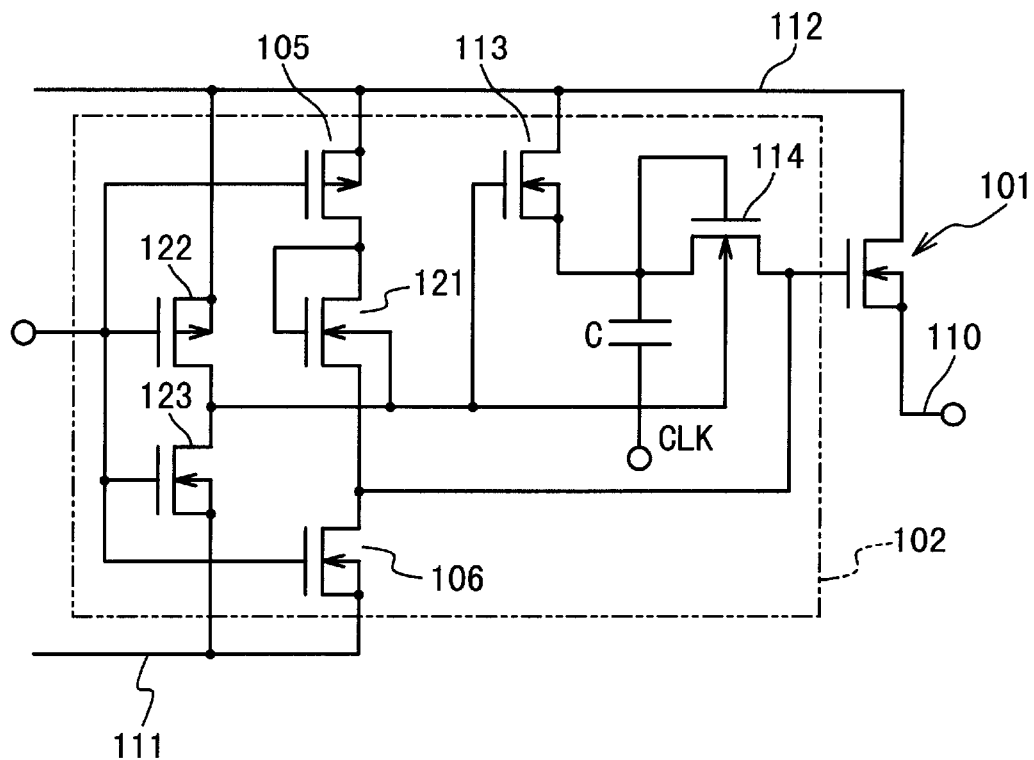
FIG. 2 is a circuit diagram showing a gate driving circuit of the conventional output circuit.
Figure 3:
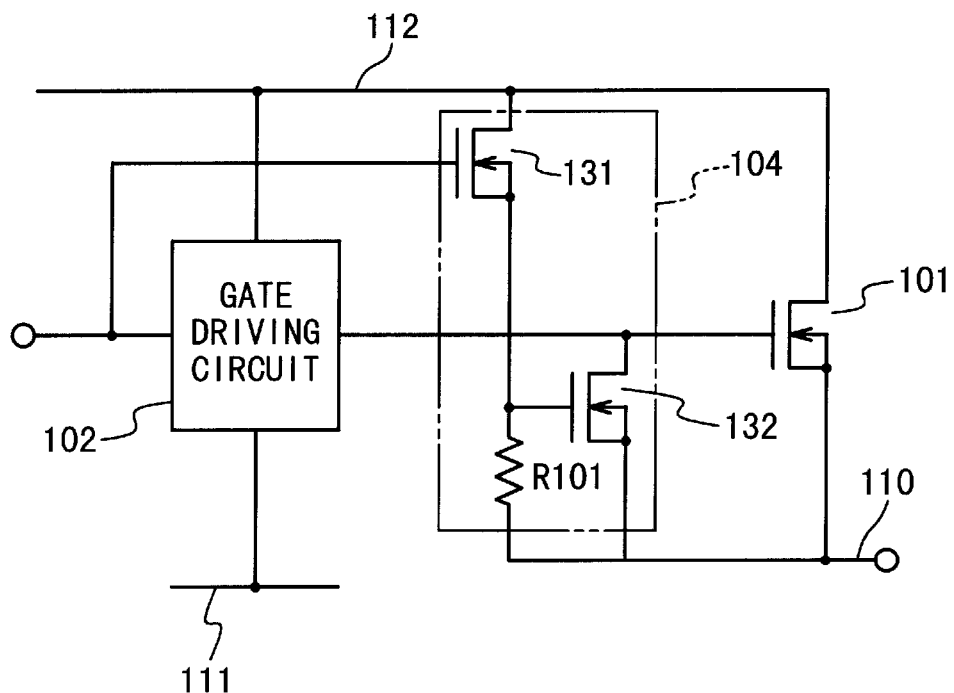
FIG. 3 is s circuit diagram showing a switch of the conventional output circuit.
Figure 4:
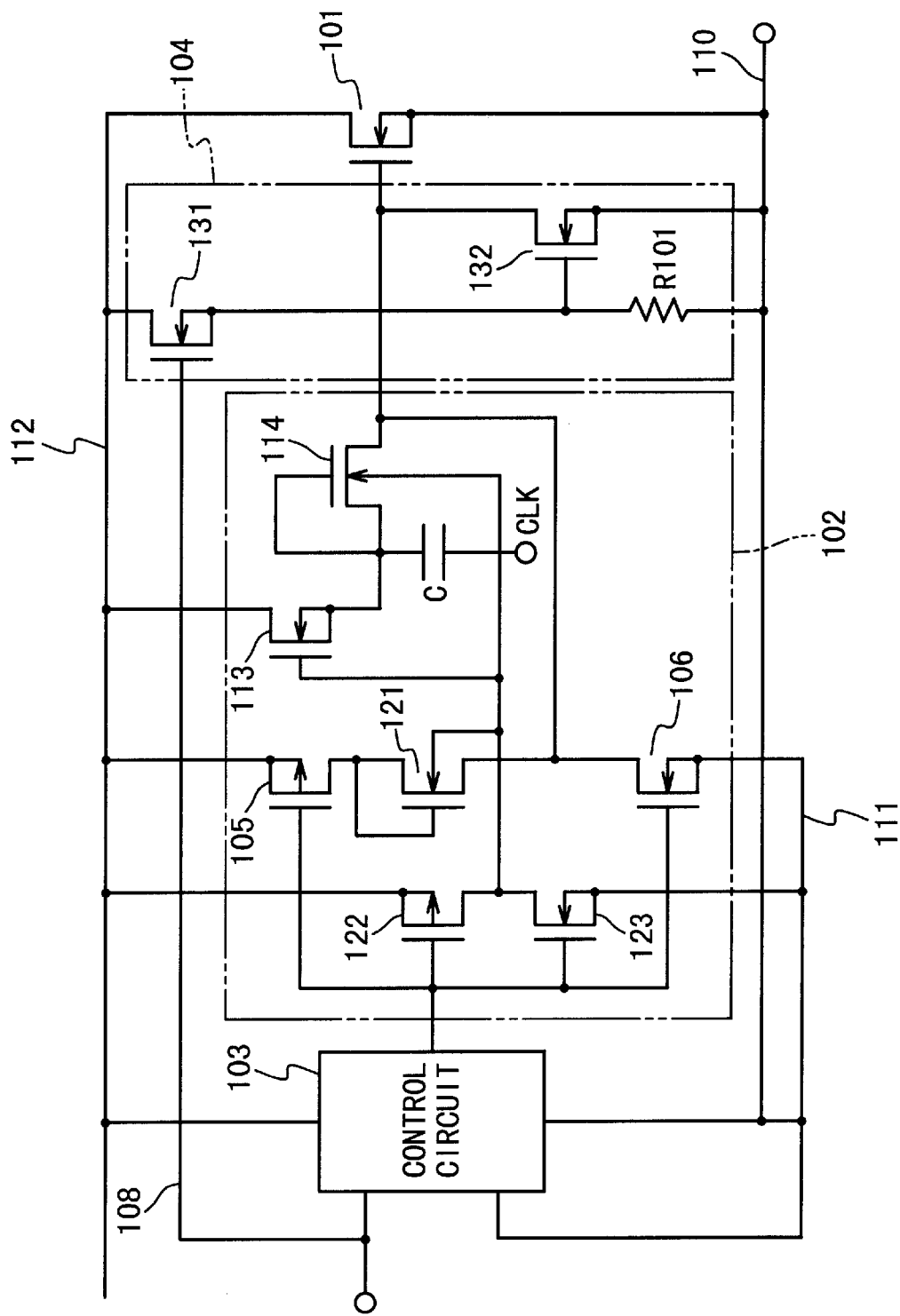
FIG. 4 is a diagram showing a modification of the conventional output circuit of the semiconductor circuit.
Figure 5:
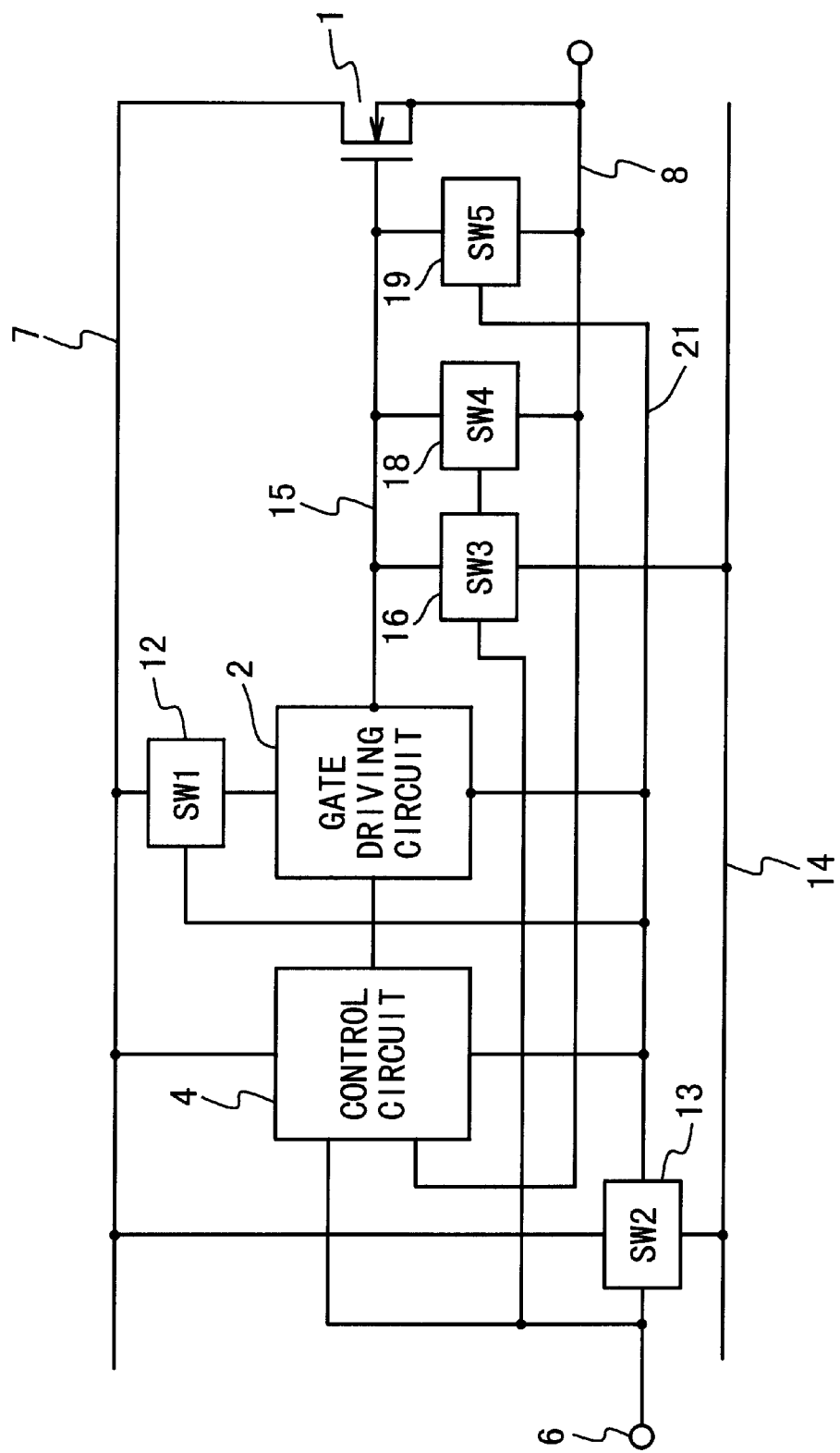
FIG. 5 is a block diagram showing the circuit structure of an output circuit of a semiconductor circuit according to a first embodiment of the present invention.

FIG. 5 is a block diagram showing the structure of the output circuit of the semiconductor circuit according to the first embodiment of the present invention. Referring to FIG. 5, the output circuit in the first embodiment is comprised of a higher potential side power supply line 7, a lower potential side power supply line 14, a control signal line 21, and an output signal line 8.

An output transistor 1 is an N-channel MOS transistor and has a drain connected to the higher potential side power supply line 7 and a source connected to the output signal line 8.

A switch (SW2) 13 is provided between the higher potential side power supply line 7 and the lower potential side power supply line 14, and has a control terminal connected to a control signal input terminal 6. The switch 13 carries out a switching operation in response to a control signal supplied to the control signal input terminal 6, and outputs the switching result onto the control signal line 21.

A control circuit 4 is provided between the higher potential side power supply line 7 and the control signal line 21. The control circuit is connected to the control signal input terminal 6 and the output signal line 8. The control circuit 4 includes an over-current detecting circuit or an over-temperature detecting circuit, which monitors the output signal on the output signal line 8 from the output transistor 1 to detect an extraordinary state. The control circuit 4 transfers the control signal as a gate control signal to the gate driving circuit 2 in a normal state. However, when the over-current detecting circuit or the over-temperature detecting circuit detects the extraordinary state, the control circuit 4 outputs a signal to prohibit the operation of the output transistor 1 as the gate control signal.

A switch (SW1) 12 is connected to the higher potential side power supply line 7, and has a control terminal connected to the control signal line. A gate driving circuit 2 is provided between the switch 12 and the control signal line 21. The gate driving circuit 2 receives the gate control signal from the control circuit 4 and generates a gate drive signal to output onto the gate signal line 15. The gate driving circuit 2 may includes a voltage boosting circuit.

A switch (SW5) 19 is provided between the gate signal line 15 and the output signal line 8. The switch 19 has a control terminal connected to the control signal line 21.

A switch (SW3) 16 is provided between the gate signal line 15 and the lower potential side power supply line 14. The switch 16 has a control terminal connected to the control signal input terminal 6. The switch 16 carries out a switching operation in response to the control signal and outputs the switching result to the switch (SW4) 18. The switch 18 is provided between the gate signal line 15 and the output signal line 8. The switch 18 has a control terminal connected to the switch 16 and carries out a switching operation in response to the output of the switch 16.

The control signal is supplied from the control signal input terminal 6, passed through the control circuit 4 in a normal state and supplied to the gate driving circuit 2. When the control signal is in a high level, the switch 13 outputs the control signal in a low level on the control signal line 21. Also, the switch 13 connects the control signal line 21 to the lower potential side power supply line 14 in response to the control signal in the high level.

As a result, the switch 19 is turned off. The switch 16 outputs a switching control signal in the low level to the switch 18 in response to the control signal in the high level. The switch 18 is turned off in response to the switching control signal from the switch 16. Also, the switch 12 supplies the power supply voltage to the gate driving circuit 2 and the gate driving circuit 2 becomes active. Also, the control circuit 4 becomes active. The gate drive signal is supplied from the gate driving circuit 2 to the gate of the output transistor 1. Thus, the output transistor 1 operates in response to the gate drive signal outputted from the gate driving circuit 2 and an output signal onto the output signal line 8.

On the other hand, when the control signal is in the low level, the switch 13 outputs the control signal in the high level on the control signal line 21. Also, the switch 13 disconnects the control signal line 21 from the lower potential side power supply line 14 in response to the control signal in the low level.

As a result, the switch 12 stops the supply of the power supply voltage to the gate driving circuit 2 and the gate driving circuit 2 becomes inactive. Also, the control circuit 4 becomes inactive. That is, the circuits 2 and 4 are in the floating state. The switch 19 is turned on based on the control signal in the high level. The switch 16 outputs a switching control signal in the high level to the switch 18 in response to the control signal in the low level. The switch 18 is turned on in response to the switching control signal from the switch 16.

As described above, if the control signal 5 is in the high level, the switch 12 is set to an on state, and the fourth switch 18 and the fifth switch 19 are set to an off state. Also, the switches 13 and 16 outputs a signal obtained inverting the control signal. As a result, the potential of the switching control line 21 becomes equal to the potential of the lower potential side power supply line 14. In the state that the switch 12 is in the on state and that the potential of the control signal line 21 is equal to that of the lower potential side power supply line 14, the control circuit 4 and the gate driving circuit 2 are connected with the higher potential side power supply line 7 and the lower potential side power supply line 14. The gate control signal is applied to the gate of the output transistor 1 by the control circuit 4 and the gate driving circuit 2 as the voltage higher than the power supply voltage, as described in the conventional example. Thus, the output transistor 1 is set to the on state. Similarly, the high voltage is generated by the voltage boosting circuit of the gate driving circuit.

If the control signal is in the low level, the switch 12 is set to the off state, and the switches 13 and 16 inverts the control signal. Also, the switches 18 and 19 are set to the on state, and the gate of the output transistor 1 and the source of the output transistor 1 are connected by the switch 18 or the switch 19. Charge accumulated in the gate of the output transistor 1 is discharged through the switch 18 or the switch 19 and the output of the output transistor 1 is set to the off state. Thus, it is prevented that the output transistor 1 is turned on, even when the source potential of the output transistor 1 becomes negative. Because the switch 13 is set to the off state, and the control circuit 4 and the gate driving circuit 2 are in the floating state. In such a floating state while the output transistor 1 is in the off state, the circuit current of each of the control circuits 4 and the gate driving circuits 2 is not consumed. Dark current of the control circuit 4 and the gate driving circuit 2 is zero. Moreover, in this state, the switch 12 is in the off state. Therefore, the route where parasitic current flows through the output transistor 1 from the gate driving circuit 2 is not formed, when the output transistor 1 is in the off state and the output signal line 8 is in a negative potential. Thus, the consumption current in the output circuit in the first embodiment becomes small.

In this way, when the switch 12 connects the higher potential side power supply line 7 and the gate driving circuit 2, the output transistor 1 is in the on state. When the gate driving circuit 2 is disconnected from the higher potential side power supply line 7, the output transistor 1 is set to the off state. The switch 13 outputs the potential of the lower potential side power supply line 14 as the control signal, and the output transistor 1 is set to the on state.

Figure 6:
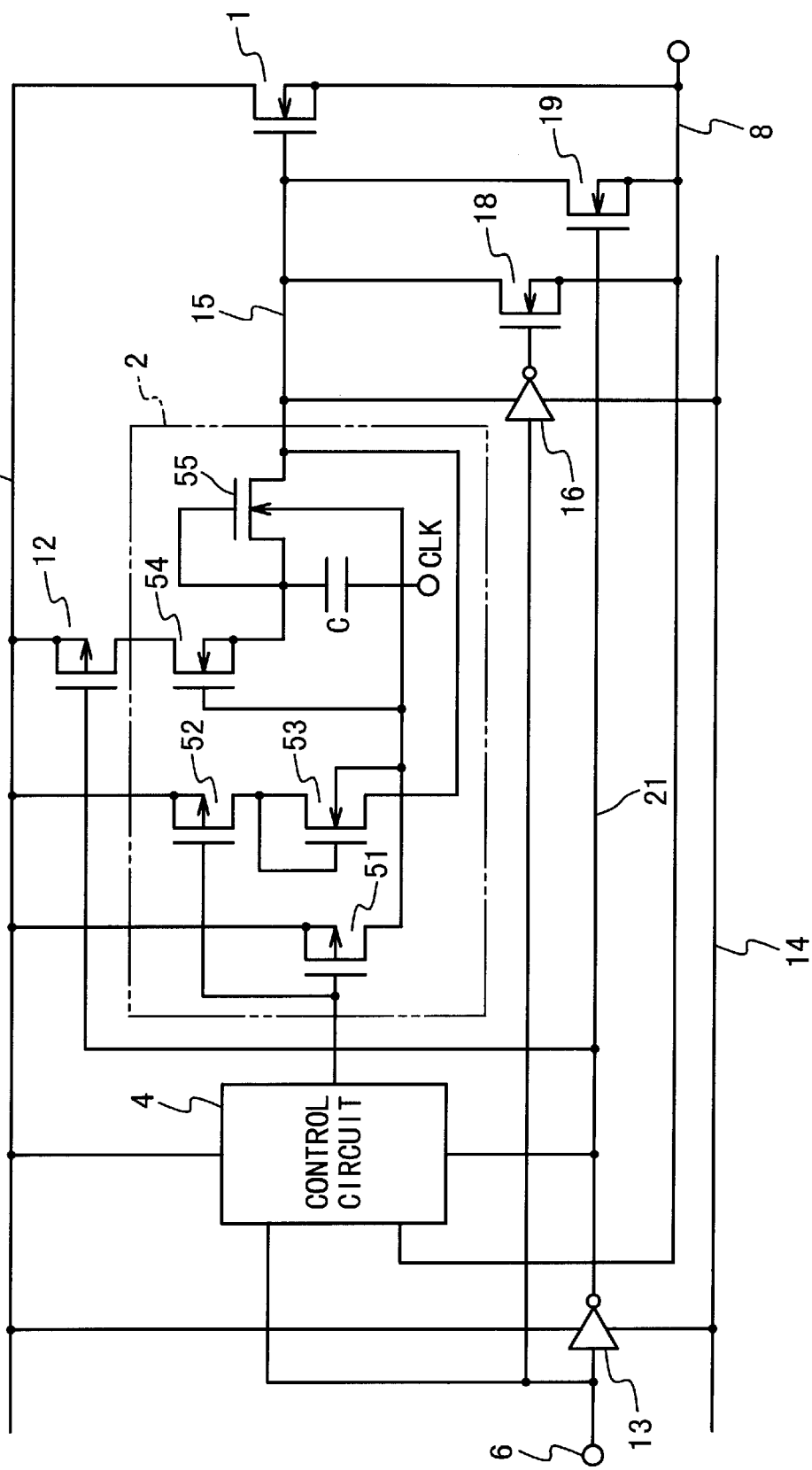
FIG. 6 is a circuit diagram showing the circuit structure of the output circuit of the semiconductor circuit according to a second embodiment of the present invention.

FIG. 6 shows the output circuit of the semiconductor circuit according to the second embodiment of the present invention. The second embodiment is similar to the first embodiment. Therefore, the output circuit in the second embodiment will be described, with reference to FIGS. 5 and 6.

Referring to FIG. 6, the switch 12 is formed of a P-channel MOS transistor. The switch 13 is formed of an inverter circuit. The switch 16 is formed of an inverter circuit. The switch 18 is formed of an N-channel MOS transistor. The switch 19 is formed of an N-channel MOS transistor. The above-mentioned switching operation is carried out sequentially and synchronously by such a switch group.

The gate driving circuit 2 is comprised of P-channel transistors 51 and 52, N-channel transistors 53, 54 and 55, and a capacitor C. The P-channel transistors 51 and 52 are connected with the higher potential side power supply line 7, and the gates of these transistors are connected to the output of the control circuit 4. The drain of the P-channel transistor 51 is connected to back gates of the N-channel transistors 53 and 55, the gate of the N-channel transistors 53 and 55. The drain of the transistor 52 is connected to the N-channel transistor 53 with a diode connection. The source of the N-channel transistor 53 is connected with the gate signal line 15. The drain of the N-channel transistor 54 is connected to the drain of the P-channel transistor of the switch 12. The source of the N-channel transistor 54 is connected to the N-channel transistor 55 with a diode connection and the capacitor C. The other end of the capacitor C is connected to a clock signal CLK. The source of the N-channel transistor 55 is connected with the gate signal line 15. The N-channel transistors 54 and 55 and the capacitor C form the voltage boosting circuit. The N-channel transistors 53 and 55 are provided to prevent of inverse flow of current when the gate voltage is increased higher than the power supply voltage. When the clock signal CLK is in the low level, the capacitor C is charged through the transistor 54 and when the clock signal CLK is in the high level, the voltage of twice of the power supply voltage is supplied to the gate of the output transistor 1 through the gate signal line 15.

Figures 7A, 7B, 7C:
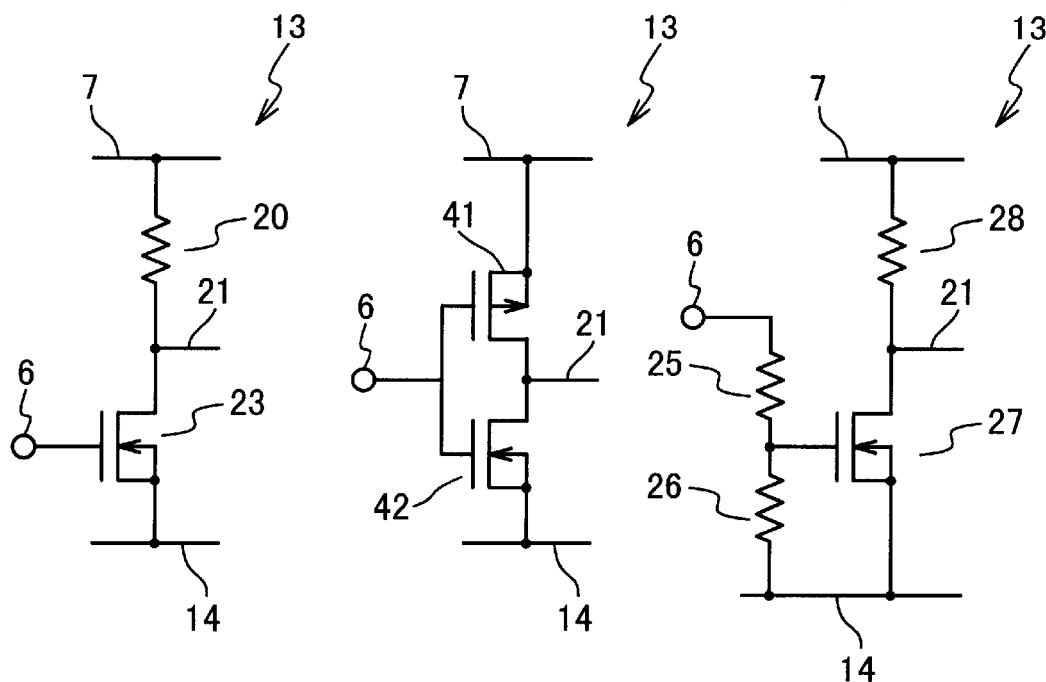
FIGS. 7A, 7B and 7C are diagrams showing examples of an inverter circuit used in the output circuit of the semiconductor circuit in the first or second embodiment, respectively.

As shown in FIG. 7A, the switch 13 in the first embodiment or the inverter 13 in the second embodiment is comprised of a resistance 20 connected with the higher potential side power supply line 7, and an N-channel MOS transistor 23 interposed between the resistance 20 and the lower potential side power supply line 14. The one end of resistance 20 is connected with the higher potential side power supply line 7, and the other end is connected with the drain terminal of the N-channel MOS transistor 23. The source of the N-channel MOS transistor 23 is connected with the lower potential side power supply line 14. The gate of the N-channel MOS transistor 23 is connected with the control signal input terminal 6. The control signal line 21 is connected with the connection point between the resistance 20 and the N-channel MOS transistor 23.

As shown in FIG. 7B, the switch 13 in the first embodiment or the inverter 13 in the second embodiment is comprised of a CMOS inverter circuit. The control signal line 21 is connected with the connection point between two transistors of the CMOS inverter circuit.

As shown in FIG. 7C, the switch 13 in the first embodiment or the inverter 13 in the second embodiment is comprised of voltage dividing resistances 25 and 26 connected between the control signal input terminal 6 and the lower potential side power supply line 14 in series, an N-channel MOS transistor 27 whose gate is connected to the connection point between the resistances 25 and 26, and a resistance 28 interposed between the drain of the N-channel MOS transistor 27 and the higher potential side power supply line 7. The source of the N-channel MOS transistor 27 is connected with the lower potential side power supply line 14. The control signal line 21 is connected with the connection point between the resistance 28 and the N-channel MOS transistor 27. When a battery voltage is supplied, for example, the voltage on the higher potential side power supply line 7 is equal to the voltage of the battery potential and the input voltage is equal to the battery voltage, the N-channel MOS transistor 27 can be protected by the resistances 25 and 26, when the potential of the higher potential side power supply line 7 becomes extraordinary and a dump serge is generated.

In each of the examples shown in FIGS. 7A, 7B and 7C, when the control signal input terminal 6 is in the high level, the switch 13 outputs the control signal in the low level, and when the control signal input terminal 6 is in the low level, the switch 13 outputs the control signal in the high level.

Figure 8:
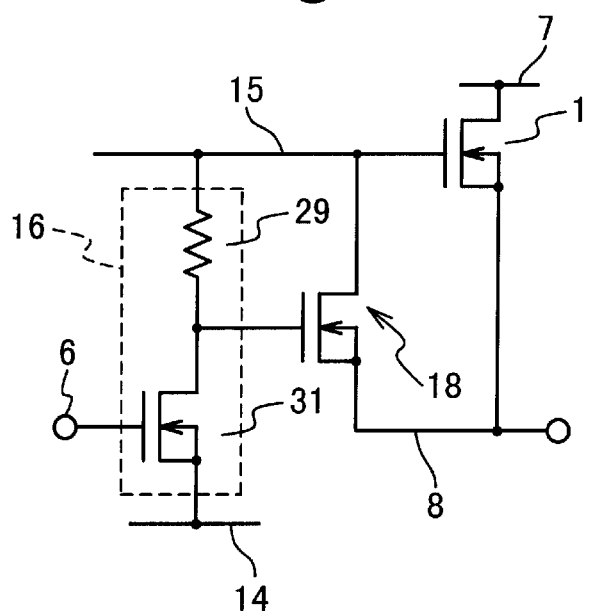
FIG. 8 is a circuit diagram showing an inverter circuit used in the output circuit of the semiconductor circuit in the first or second embodiment.

FIG. 8 shows the switch 16 in the first or second embodiment. The switch 16 is comprised of a resistance 29 and an N-channel MOS transistor 31. One end of the resistance 29 is connected with the gate of the N-channel MOS transistor as the output transistor 1. The other end of the resistance 29 is connected with the drain of the N-channel MOS transistor 31. The source of the N-channel MOS transistor 31 is connected with the lower potential side power supply line 14, and the gate of the N-channel MOS transistor 31 is connected with the control signal input terminal 6. A connection point between the resistance 29 and the N-channel MOS transistor 31 is connected with the gate of the above-mentioned switch 18.

When the control signal input terminal 6 is in the high level, the switch 16 outputs the control signal in the low level to set the switch 18 to the off state. When the control signal input terminal 6 is in the low level, the switch 16 outputs the control signal in the high level to set the switch 18 to the on state. Because the switch 16 is in the on state when the control signal input terminal 6 is in the high level, it is desirable that the switch 16 has a high resistance value to reduce power consumption in the on state. Moreover, it is desirable that the resistance 29 of the switch 16 or the switch 16 has a high resistance value in the point that parasitic current which flows through the route of the lower potential side power supply line 14 the switch 16 the switch 18 the output signal line 8 can be made small, in the case that the switch 12 is in the off state, that the output transistor 1 is in the off state and that the output signal line 8 becomes negative potential.

Figure 9:
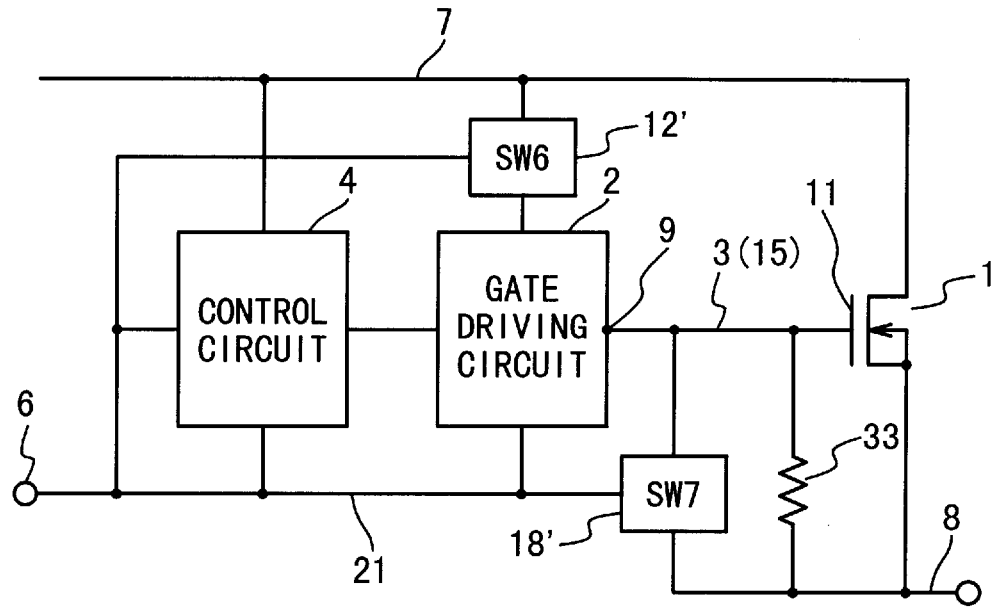
FIG. 9 is a block diagram showing the circuit structure of the output circuit according to a third embodiment of the present invention.

FIG. 9 shows the output circuit of the semiconductor circuit according to the third embodiment of the present invention. In this embodiment, the lower potential side power supply line 14 in the above-mentioned embodiments does not exist. The drain of the output transistor 1 is connected with the higher potential side power supply line 7. A control signal input terminal 6 is connected to the switch (SW6) 12', the control circuit 4 and switch (SW7) 18'. The control circuit 4 which is the same as that of the first embodiment is provided the control signal line 21 and the higher potential side power supply line 7. The switch 12' is connected with the higher potential side power supply line 7, and the gate driving circuit 2 is provided between the switch 12' and the control signal line 21. The switch 18' is provided between the gate signal line 15 and the output signal line 8 in parallel to a resistance 33. The switch 12' carries out the switching operation based on the control signal supplied to the control signal input terminal 6. The switch 18' corresponds to the switch 18 functionally.

When the control signal 6 is in the low level, the switch 12' is set to the on state and the switch 18' is set to the off state. The control circuit 4 passes the control signal to the gate driving circuit 2. The gate driving circuit 2 in the third embodiment is similar to that of the first embodiment. The gate driving circuit 2 supplies the gate drive signal to the gate of the output transistor 1 on the gate signal line 15, as the voltage higher than the power supply voltage. Thus, the output of the output transistor 1 is set to the on state.

When the control signal 6 is in the high level, the switch 12' is set to the off state and the switch 18' is set to the on state. The gate 11 and source of the output transistor 1 are connected to form a short circuit. Charge accumulated in the gate of the output transistor 1 is discharged through the switch 18' and the resistance 33, and the output of the output transistor 1 is set to the off state quickly. Also, even when the source potential becomes negative potential, it can be prevented that the output transistor 1 is set to the on state. Moreover, the control circuit 4 and the gate driving circuit 2 are in a floating state. In this way, if the output transistor 1 is in the off state, the circuit current of the control circuit 4 and the circuit current of the gate driving circuit 2 are not consumed and the circuit current can be made zero. Because the switch 12' is in the off state, a route is not formed in which parasitic current flows through the gate signal line 15, and the consumption current in the switching operation becomes small.

Figure 10:
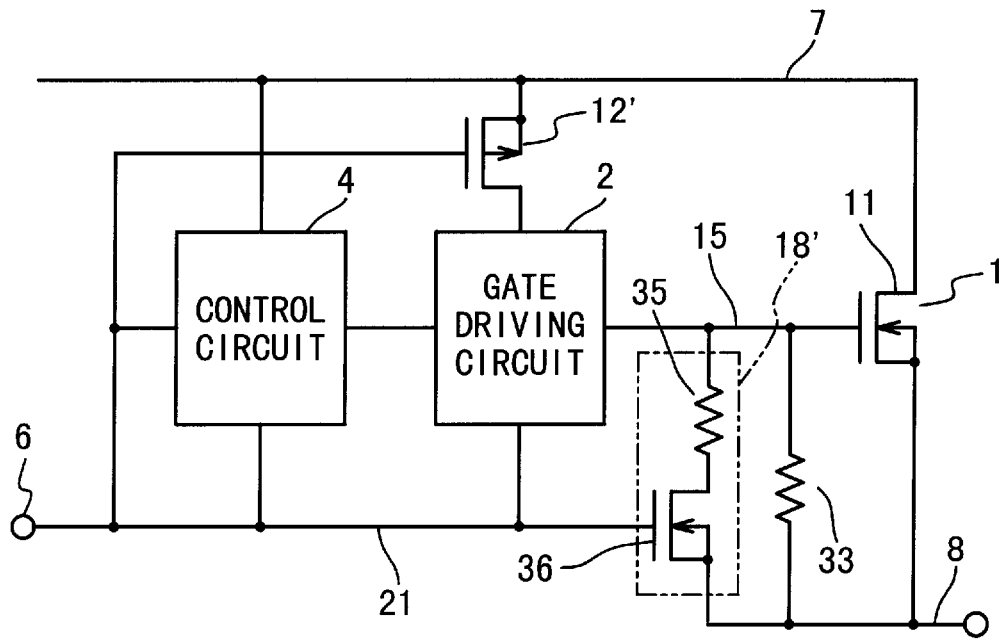
FIG. 10 is a diagram showing the output circuit in the third embodiment in detail.

FIG. 10 shows the switches 12' and 18' in the output circuit in the third embodiment more specifically. In this example, the switch 12' is comprised of a P-channel transistor. The switch 18' is comprised of a resistance 35 and an N-channel MOS transistor 36.

Figure 11:
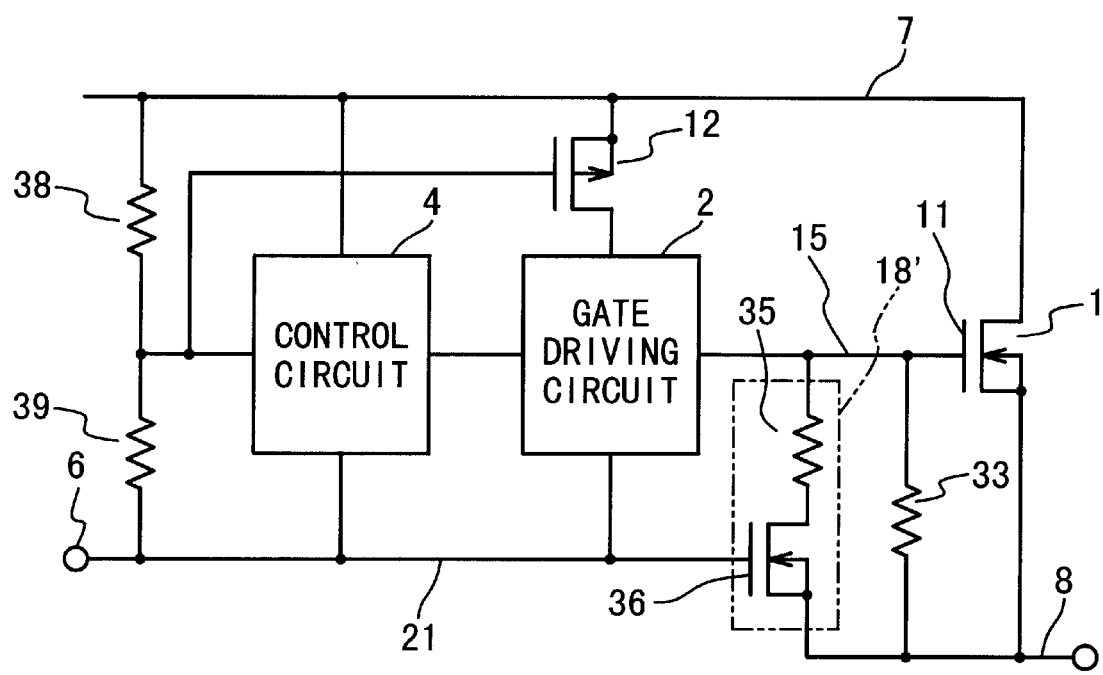
FIG. 11 is a diagram showing a modification of the output circuit in the third embodiment in detail.

FIG. 11 shows a modification of the circuit of FIG. 10. A resistance 38 and a resistance 39 are inserted between the higher potential side power supply line 7 and the control signal line 21 in series. The control signal input terminal 6 is connected with the control circuit 4 through the voltage dividing point between the resistance 38 and the resistance 39. The remaining circuit of FIG. 11 is the same as the circuit of FIG. 10 except for the addition of the resistance 38 and the resistance 39.

The output circuit of the semiconductor circuit according to the present invention can restrain the generation of dark current in the gate driving circuit. Moreover, no parasitic current flows through the output circuit to the source of an output transistor, when a negative voltage is applied to the source of the output transistor.

What is claimed is:
1. An output circuit of a semiconductor circuit, comprising:
   a higher potential side power supply line;
   an output signal line on which an output signal is outputted;
   a control signal line on which a control signal is transferred;
   a gate signal line on which a gate signal is transferred;
   an output transistor connected between said higher potential side power supply line and said output signal line to operate in response to said gate signal on said gate signal line;
   a first switch connected to said higher potential side power supply line to turn off in response to said control signal of a first state and turn on in response to said control signal of a second state; and
   a gate drive circuit connected between said first switch and said control signal line to generate said gate signal onto said gate signal line based on a gate control signal when said first switch is turned on,
   wherein said output transistor is a first N-channel transistor, and
   said output circuit further comprises:
       a second switch connected between said gate signal line and said output signal line to turn on in response to said control signal of said first state and to turn off in response to said control signal off said second state.
2. The output circuit according to claim 1, further comprising:
   A first resistance connected between said gate signal line and said output signal line.
3. An output circuit of a semiconductor circuit, comprising:
   a higher potential side power supply line;
   an output signal line on which an output signal is outputted;
   a control signal line on which a control signal is transferred;
   a gate signal line on which a gate signal is transferred;
   an output transistor connected between said higher potential side power supply line and said output signal line to operate in response to said gate signal on said gate signal line;
   a first switch connected to said higher potential side power supply line to turn off in response to said control signal of a first state and turn on in response to said control signal of a second state; and
   a gate drive circuit connected between said first switch and said control signal line to generate said gate signal onto said gate signal line based on a gate control signal when said first switch is turned on,
   wherein said first switch comprises a first P-channel transistor, and
   said control signal is supplied directly to a gate of said first P-channel transistor.
4. An output circuit of a semiconductor circuit, comprising:
   a higher potential side power supply line;
   an output signal line on which an output signal is outputted;
   a control signal line on which a control signal is transferred;

a gate signal line on which a gate signal is transferred;

an output transistor connected between said higher potential side power supply line and said output signal line to operate in response to said gate signal on said gate signal line;

a first switch connected to said higher potential side power supply line to turn off in response to said control signal of a first state and turn on in response to said control signal of a second state;

a gate drive circuit connected between said first switch and said control signal line to generate said gate signal onto said gate signal line based on a gate control signal when said first switch is turned on; and second and third resistances connected between said higher potential side power supply line and said control signal line in series, wherein said first switch comprises a first P-channel transistor, and said control signal is supplied to a gate of said first P-channel transistor via said third resistance.

5. An output circuit of a semiconductor circuit, comprising:

a higher potential side power supply line;

an output signal line on which an output signal is outputted;

a control signal line on which a control signal is transferred;

a gate signal line on which a gate signal is transferred;

an output transistor connected between said higher potential side power supply line and said output signal line to operate in response to said gate signal on said gate signal line;

a first switch connected to said higher potential side power supply line to turn off in response to said control signal of a first state and turn on in response to said control signal of a second state;

a gate drive circuit connected between said first switch and said control signal line to generate said gate signal onto said gate signal line based on a gate control signal when said first switch is turned on; and a control circuit connected between said higher potential side power supply line and said control signal line to generate said gate control signal from said control signal.

6. An output circuit of a semiconductor circuit, comprising:

a higher potential side power supply line;

an output signal line on which an output signal is outputted;

a control signal line on which a control signal is transferred;

a gate signal line on which a gate signal is transferred;

an output transistor connected between said higher potential side power supply line and said output signal line to operate in response to said gate signal on said gate signal line;

a first switch connected to said higher potential side power supply line to turn off in response to said control signal of a first state and turn on in response to said control signal of a second state;

a gate drive circuit connected between said first switch and said control signal line to generate said gate signal onto said gate signal line based on a gate control signal when said first switch is turned on;

a lower potential side power supply line; and a control circuit connected between said higher potential side power supply line and said lower potential side power supply line, to generate said gate control signal from said output signal in addition to said control signal.

7. The output circuit according to claim 5, wherein said control circuit includes at least one of an over-current detecting circuit or an over-temperature detecting circuit, and generates said gate control signal from an output of said at least one of an over-current detecting circuit or an over-temperature detecting circuit, in addition to at least one of said control signal and said output signal.

8. The output circuit according to claim 6, wherein said control circuit includes at least one of an over-current detecting circuit or an over-temperature detecting circuit, and generates said gate control signal from an output of said at least one of an over-current detecting circuit or an over-temperature detecting circuit, in addition to at least one of said control signal and said output signal.

9. An output circuit of a semiconductor circuit, comprising:

a higher potential side power supply line;

an output signal line on which an output signal is outputted;

a control signal line on which a control signal is transferred;

a gate signal line on which a gate signal is transferred;

an output transistor connected between said higher potential side power supply line and said output signal line to operate in response to said gate signal on said gate signal line;

a first switch connected to said higher potential side power supply line to turn off in response to said control signal of a first state and turn on in response to said control signal of a second state;

a gate drive circuit connected between said first switch and said control signal line to generate said gate signal onto said gate signal line based on a gate control signal when said first switch is turned on;

a lower potential side power supply line; and a third switch connected between said higher potential side power supply line and said lower potential side power supply line to generate said control signal of said first state based on a supplied control signal of said second state and to generate said control signal of said second state based on said supplied control signal of said first state and outputs said control signal onto said control signal line.

10. The output circuit according to claim 9, wherein said third switch connects said control signal line to said lower potential side power supply line in response to said supplied control signal of said first state.

11. The output circuit according to claim 8, further comprising:

a fourth switch connected between said gate signal line and said lower potential side power supply line to generate a switching control signal of said first state in response to said supplied control signal of said second state and to generate said switching control signal of said second state in response to said supplied control signal of said first state; and a fifth switch connected between said gate signal line and said output signal line to turn on in response to said switching control signal of said first state and to turn off in response to said switching control signal of said second state.

12. The output circuit according to claim 11, wherein said fourth switch comprises:
   a fourth resistance connected with said gate signal line; and
   a second N-channel transistor connected between said fourth resistance and said lower potential side power supply line to turn off in response to said supplied control signal of said second state and to turn on in response to said supplied control signal of said first state.

13. The output circuit according to claim 12, wherein said fourth resistance has a resistance value for suppressing parasitic current.

14. The output circuit according to claim 9, wherein said third switch comprises:
   a fifth resistance connected with said higher potential side power supply line; and
   a third N-channel transistor connected between said fifth resistance and said lower potential side power supply line to receive said supplied control signal at a gate of said N-channel transistor, and
   said control signal line is connected to a node between said fifth resistance and said third n-channel transistor.

15. The output circuit according to claim 9, wherein said third switch comprises:
   a fifth resistance connected with said higher potential side power supply line;
   sixth and seventh resistances connected with said lower potential side power supply line in series; and
   a third N-channel transistor connected between said fifth resistance and said lower potential side power supply line to receive said supplied control signal at a gate of said third N-channel transistor via said sixth resistance, and
   said control signal line is connected to a node between said fifth resistance and said third n-channel transistor.

16. The output circuit according to claim 9, wherein said third switch comprises:
   a second P-channel transistor connected with said higher potential side power supply line; and
   a fourth N-channel transistor connected between said second p-channel transistor and said lower potential side power supply line,
   said supplied control signal is supplied to a gate of each of said fourth N-channel transistor and said second P-channel transistor, and
   said control signal line is connected to a node between said fourth N-channel transistor and said second P-channel transistor.

* * * * *